United States Patent
Sakamoto

(10) Patent No.: US 8,084,333 B2
(45) Date of Patent: Dec. 27, 2011

(54) OBJECT CUTTING METHOD

(75) Inventor: Takeshi Sakamoto, Hamamatsu (JP)

(73) Assignee: Hamamatsu Photonics K.K., Hamamatsu-shi, Shizuoka (JP)

( * ) Notice: Subject to any disclaimer, the term of this patent is extended or adjusted under 35 U.S.C. 154(b) by 388 days.

(21) Appl. No.: 12/031,382

(22) Filed: Feb. 14, 2008

(65) Prior Publication Data

US 2009/0098713 A1    Apr. 16, 2009

(30) Foreign Application Priority Data

Oct. 12, 2007 (JP) .............................. P2007-267048
Dec. 18, 2007 (JP) .............................. P2007-326304

(51) Int. Cl.
*H01L 21/00* (2006.01)
(52) U.S. Cl. .. 438/460; 438/463; 438/464; 257/E21.238
(58) Field of Classification Search ................. 438/460, 438/463, 464; 257/E21.238
See application file for complete search history.

(56) References Cited

U.S. PATENT DOCUMENTS

| | | | |
|---|---|---|---|
| 6,992,026 B2 | 1/2006 | Fukuyo et al. | |
| 2004/0002199 A1 | 1/2004 | Fukuyo et al. | |
| 2005/0173387 A1 | 8/2005 | Fukuyo et al. | |
| 2007/0111476 A1 | 5/2007 | Sugiura et al. | |
| 2009/0098713 A1* | 4/2009 | Sakamoto | 438/463 |
| 2009/0162994 A1 | 6/2009 | Sakamoto | |
| 2010/0275990 A1* | 11/2010 | Shimomura et al. | 136/256 |

FOREIGN PATENT DOCUMENTS

| | | |
|---|---|---|
| JP | 63-260407 | 10/1988 |
| JP | 2007-141997 | 6/2007 |
| JP | 2007-142206 | 6/2007 |

OTHER PUBLICATIONS

D. Du et al., "Laser-induced breakdown by impact ionization in SiO2 with pulse widths from 7 ns to 150 fs," Database Compendex [Online] Engineering Information, Inc., NewYork, NY, US, Database Accession No. EIX95032454204, XP002510584.

* cited by examiner

*Primary Examiner* — Jack Chen
(74) *Attorney, Agent, or Firm* — Drinker Biddle & Reath LLP

(57) ABSTRACT

An object cutting method which can reliably remove particles remaining on cut sections of chips is provided. An expandable tape 23 is electrically charged in a state where a plurality of semiconductor chips 25 obtained by cutting a planar object to be processed along a line to cut are separated from each other on the expandable tape 23. This electric action causes particles remaining on cut sections of the semiconductor chips 25 to eject therefrom even when a molten processed region is formed in the cut sections. Therefore, particles remaining on the cut sections of the chips 25 can reliably be removed.

12 Claims, 15 Drawing Sheets

*Fig.13*
(a)
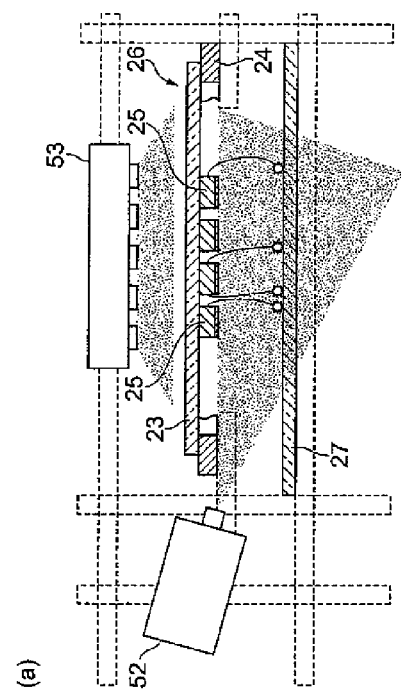
(b)
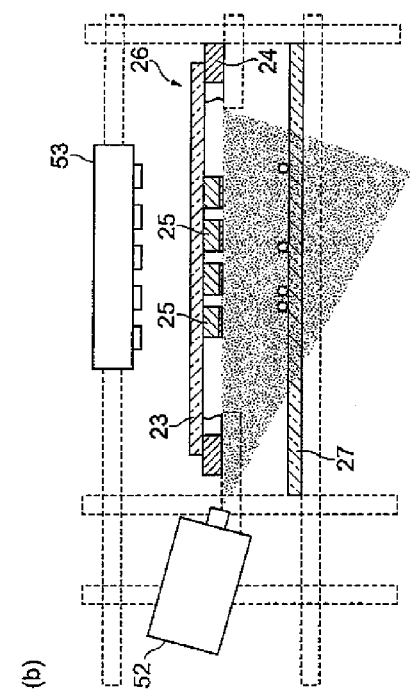
*Fig.14*
(a)
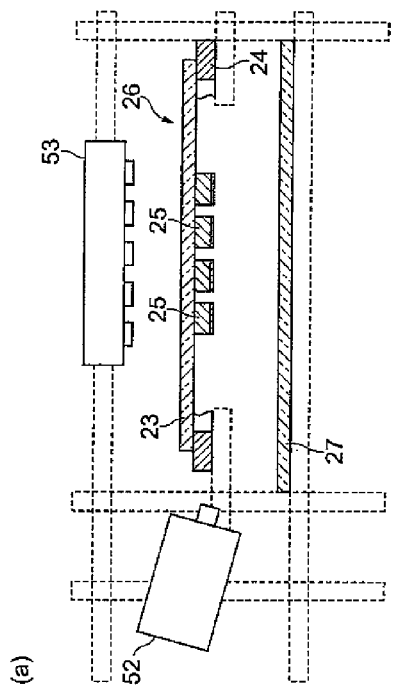
(b)
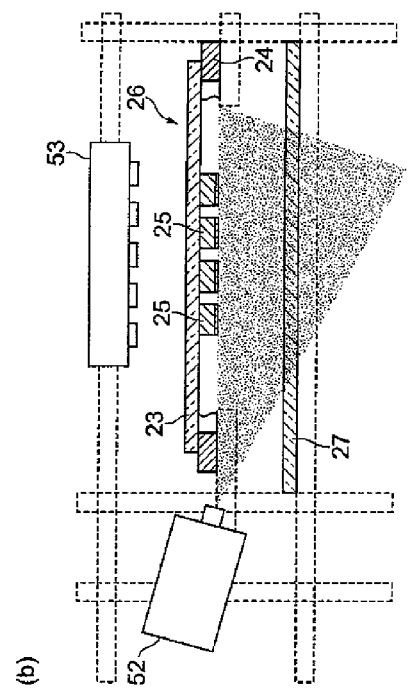

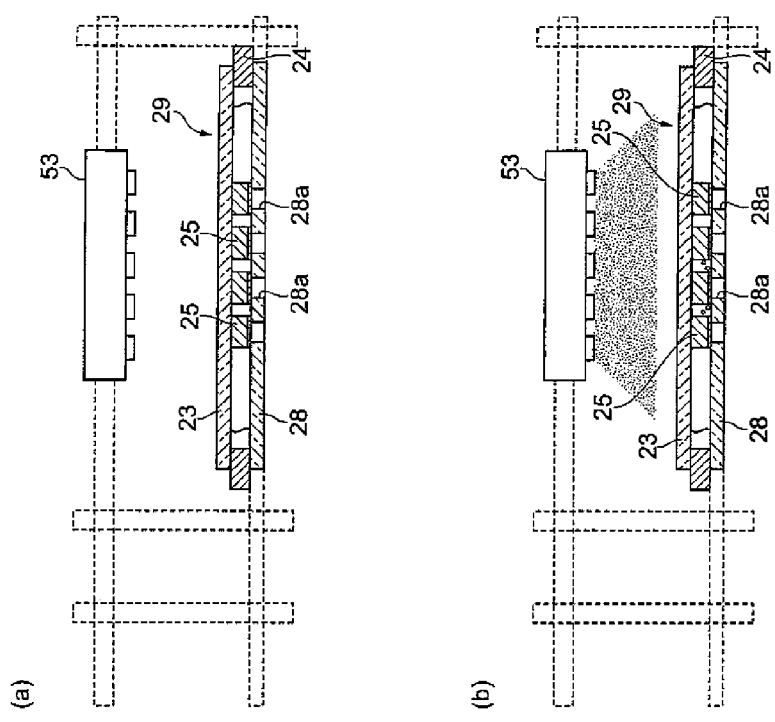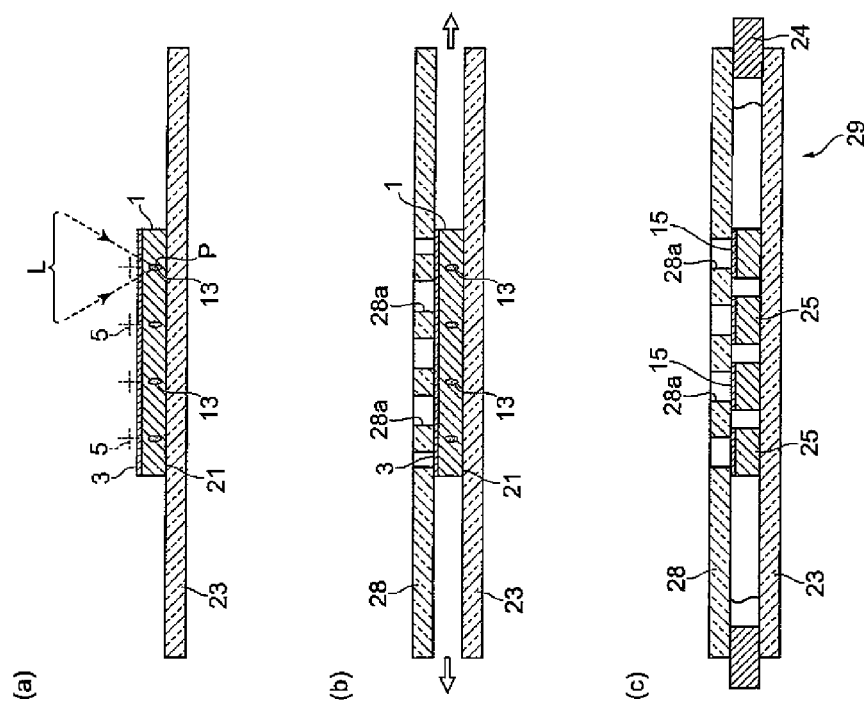

Fig.27

| | CHARGED POSITIVE | | CHARGED NEGATIVE | | NO CHARGE | |
|---|---|---|---|---|---|---|
| | CHARGE AMOUNT | DUST AMOUNT | CHARGE AMOUNT | DUST AMOUNT | CHARGE AMOUNT | DUST AMOUNT |
| (a) | +20 | 0 (TOTAL=0) | -20 | 0 (TOTAL=0) | 0 | 0 (TOTAL=0) |
| (b) | +20 | 0 (TOTAL=0) | -20 | 0 (TOTAL=0) | 0 | 0 (TOTAL=0) |
| (c) | 0 | 0 (TOTAL=0) | 0 | 0 (TOTAL=0) | 0 | 0 (TOTAL=0) |
| (d) | 0 | 4 (TOTAL=4) | 0 | 4 (TOTAL=4) | 0 | 4 (TOTAL=4) |
| (e) | 0 | 0 (TOTAL=4) | 0 | 0 (TOTAL=4) | 0 | 0 (TOTAL=4) |
| (f) | +20 | 110 (TOTAL=114) | -20 | 110 (TOTAL=114) | 0 | 0 (TOTAL=4) |

Fig.28

| | CHARGED POSITIVE | | CHARGED NEGATIVE | | NO CHARGE | |
|---|---|---|---|---|---|---|
| | CHARGE AMOUNT | DUST AMOUNT | CHARGE AMOUNT | DUST AMOUNT | CHARGE AMOUNT | DUST AMOUNT |
| (a) | +20 | 0 (TOTAL=0) | -20 | 0 (TOTAL=0) | 0 | 0 (TOTAL=0) |
| (b) | +20 | 0 (TOTAL=0) | -20 | 0 (TOTAL=0) | 0 | 0 (TOTAL=0) |
| (c) | +20 | 0 (TOTAL=0) | -20 | 0 (TOTAL=0) | 0 | 0 (TOTAL=0) |
| (d) | +20 | 4 (TOTAL=4) | -20 | 4 (TOTAL=4) | 0 | 4 (TOTAL=4) |
| (e) | +20 | 0 (TOTAL=4) | -20 | 0 (TOTAL=4) | 0 | 0 (TOTAL=4) |
| (f) | +20 | 0 (TOTAL=4) | -20 | 0 (TOTAL=4) | 0 | 0 (TOTAL=4) |

OBJECT CUTTING METHOD

BACKGROUND OF THE INVENTION

1. Field of the Invention

The present invention relates to an object cutting method of manufacturing a plurality of chips by cutting a planar object to be processed along a line to cut.

2. Related Background Art

As a conventional technique in the field mentioned above, Japanese Patent Application Laid-Open No. 2007-142206 discloses a technique of destaticizing a forming material of a planar object to be processed (a material forming or having formed the object), which is formed with a modified region to become a cutting start point, when applying a stress to the object through a sheet. Also, Japanese Patent Application Laid-Open No. 63-260407 discloses a technique of blowing ion air for neutralizing static electricity against a planar object to be processed, which is formed with a scribe line, when applying a stress to the object through a sheet. Further, Japanese Patent Application Laid-Open No. 2007-141997 discloses a technique of attracting particles from a chip surface by static electricity, so as to remove them.

SUMMARY OF THE INVENTION

When the above-mentioned technique disclosed in Japanese Patent Application Laid-Open No. 2007-142206 is employed, particles peeling off from cut sections of chips at the time of cutting the object from the modified region acting as a cutting start point fall onto the sheet, for example, without dispersing randomly. Therefore, the particles peeling off from the cut sections of the chips can reliably be prevented from attaching to functional devices of the chips and the like.

Particles remaining on cut sections of chips, if any, may peel off from the cut sections of the chips during a later transportation step or the like, thereby attaching to functional devices of the chips and the like. Even when the above-mentioned techniques disclosed in Japanese Patent Application Laid-Open Nos. 63-260407 and 2007-141997 are used, the particles remaining on a cut section of a chip are hard to remove in the case where the modified region is formed in the cut section.

In view of such circumstances, it is an object of the present invention to provide an object cutting method which can reliably remove particles remaining on cut sections of chips.

For achieving the above-mentioned object, in one aspect, the present invention provides an object cutting method of manufacturing a plurality of chips by cutting a planar object to be processed along a line to cut, the method comprising a cutting step of irradiating the object with laser light so as to form a modified region in the object along the line to cut and cutting the object into the chips from the modified region acting as a cutting start point, and a charging step of irradiating at least a first sheet with a chargeable first ion flow in a state where the chips are separated from each other on the first sheet In another aspect, the present invention provides an object cutting method of manufacturing a plurality of chips by cutting a planar object to be processed along a line to cut, the method comprising a cutting step of irradiating the object with laser light so as to form a modified region in the object along the line to cut and cutting the object into the chips from the modified region acting as a cutting start point, and a charging step of electrically charging at least a first sheet in a state where the chips are separated from each other on the first sheet.

In these object cutting methods, at least the first sheet is electrically charged in a state where a plurality of chips obtained by cutting a planar object to be processed along a line to cut are separated from each other on the first sheet This electric action causes particles remaining on cut sections of the chips to eject therefrom even when a modified region is formed in the cut sections. Hence, these methods can reliably remove particles remaining on the cut sections of the chips.

The modified region to become a cutting start point is formed by irradiating the object with laser light such as to cause multiphoton absorption or other kinds of optical absorption in the object. The ion flow refers to an assembly of a plurality of ions including at least one of positive and negative ions.

Preferably, in the charging step in the object cutting methods in accordance with the present invention, a second sheet is arranged such as to oppose the first sheet while holding the chip therebetween, and a dischargeable second ion flow is generated at least in an area between the chip and second sheet.

Preferably, in the charging step in the object cutting methods in accordance with the present invention, a second sheet is arranged such as to oppose the first sheet while holding the chip therebetween, and at least the second sheet is irradiated with a second ion flow chargeable to a polarity opposite from that of the first ion flow.

Preferably, in the charging step in the object cutting methods in accordance with the present invention, at least the first sheet is irradiated with the first ion flow in a state where the chips are separated from each other on the first sheet while a second sheet covering at least a gap between the chips is arranged such as to oppose the first sheet with the chips interposed therebetween.

Preferably, in the charging step in the object cutting methods in accordance with the present invention, in a state where the chips are separated from each other on the first sheet while a porous second sheet covering at least a gap between the chips is arranged such as to oppose the first sheet with the chips interposed therebetween, at least the first sheet is irradiated with the first ion flow while at least the gap is aspirated through the second sheet.

In these cases, the particles ejected from the cut sections of the chips attach to the second sheet. Therefore, these methods can reliably prevent the particles ejected from the cut sections of the chips from attaching to functional devices of the chips and the like.

Preferably, in the charging step in the object cutting methods in accordance with the present invention, the chips and first sheet are positioned such that the first sheet is located higher than the chips in a vertical direction. In this case, the particles ejected from the cut sections of the chips fall under their own weight and thus can reliably be prevented from attaching to functional devices of the chips and the like not only when the above-mentioned second sheet is used but also when not.

Preferably, in the charging step in the object cutting methods in accordance with the present invention, the first sheet is irradiated with the first ion flow from a side of the first sheet opposite from the side arranged with the chips. In this case, the whole surface of the first sheet can reliably be charged.

Preferably, in the cutting step in the object cutting methods in accordance with the present invention, the object is cut into the chips such that at least one of a forming material of the object and the first sheet has a substantially constant amount of charge. This can restrain particles peeling off from the cut sections of the chips from dispersing randomly and reliably prevent the particles from attaching to the chip surfaces. The forming material of the object to be processed refers to materials forming or having formed the object, such as the object formed with the modified region, chips obtained by cutting the object, and particles peeled off from cut sections of the chips. The amount of charge to be held constant may be positive, negative, or 0 (zero).

The object cutting methods in accordance with the present invention encompass a case where the object is equipped with a semiconductor substrate, while the modified region includes a molten processed region.

BRIEF DESCRIPTION OF THE DRAWINGS

FIG. 13 is a sectional view of a part of the object for explaining the object cutting method in accordance with the first embodiment;

FIG. 14 is a sectional view of a part of the object for explaining the object cutting method in accordance with the first embodiment;

FIG. 19 is a sectional view of a part of an object to be processed for explaining the object cutting method in accordance with a third embodiment;

FIG. 20 is a sectional view of a part of the object for explaining the object cutting method in accordance with the third embodiment;

FIG. 27 is a table showing changes in the amount of charge in an expandable tape and changes in the amount of dust on chips when using a columnar expander;

FIG. 28 is a table showing changes in the amount of charge in an expandable tape and changes in the amount of dust on chips when using a cylindrical expander.

DESCRIPTION OF THE PREFERRED EMBODIMENTS

Figure 1:
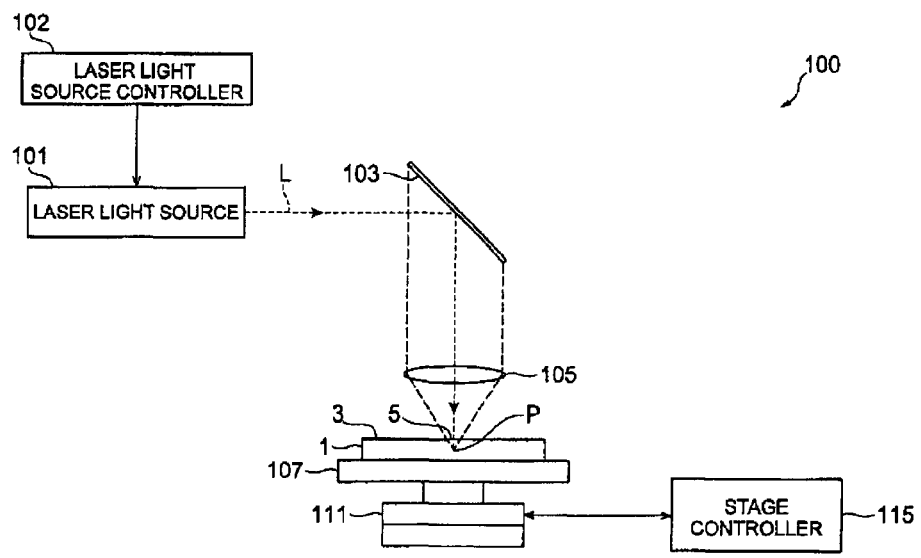
FIG. 1 is a schematic diagram of a laser processing apparatus used for forming a modified region.

In the following, preferred embodiments of the present invention will be explained in detail with reference to the drawings. In the drawings, the same or equivalent parts will be referred to with the same numerals or letters while omitting their overlapping descriptions.

The methods of cutting an object to be processed in accordance with the embodiments irradiate a planar object to be processed with laser light while locating a converging point within the object, so as to form a modified region in the object along a line to cut.

Therefore, to begin with, the forming of the modified region in the object cutting methods in accordance with the embodiments will be explained with reference to FIGS. 1 to 9.

As shown in FIG. 1, a laser processing apparatus 100 comprises a laser light source 101 for pulsatingly oscillating laser light (processing laser light) L, a dichroic mirror 103 arranged such as to change the direction of the optical axis of the laser light L by 90°, and a condenser lens 105 for converging the laser light L. The laser processing apparatus 100 further comprises a support table 107 for supporting an object to be processed 1 which is irradiated with the laser light L converged by the condenser lens 105, a stage 111 for moving the support table 107 along X, Y, and Z axes, a laser light source controller 102 for regulating the laser light source 101 in order to adjust the output, pulse width, and the like of the laser light L, and a stage controller 115 for regulating movements of the stage 111.

In the laser processing apparatus 100, the laser light L emitted from the laser light source 101 changes the direction of its optical axis by 90° with the dichroic mirror 103, and then is converged by the condenser lens 105 into the object 1 mounted on the support table 107. At the same time, the stage 11 is shifted, so that the object 1 is moved relative to the laser light L along a line to cut 5. As a consequence, a modified region to become a cutting start point is formed in the object 1 along the line to cut 5. This modified region will be explained in detail in the following.

Figure 2:
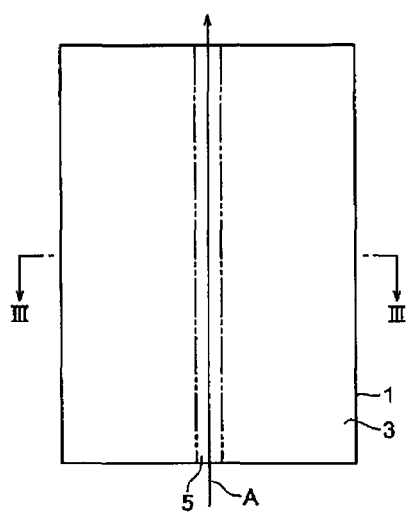
FIG. 2 is a plan view of an object to be processed in which the modified region is to be formed.
Figure 4:
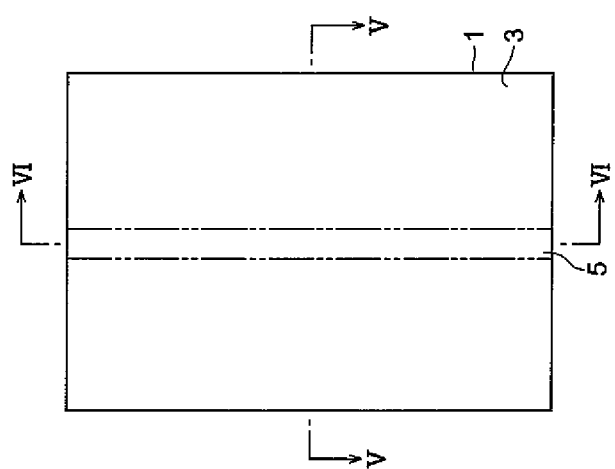
FIG. 4 is a plan view of the object after the laser processing.
Figure 3:
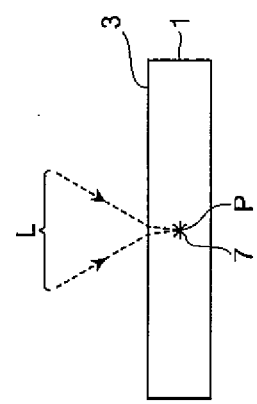
FIG. 3 is a sectional view of the object taken along the line III-III of FIG. 2.
Figure 6:
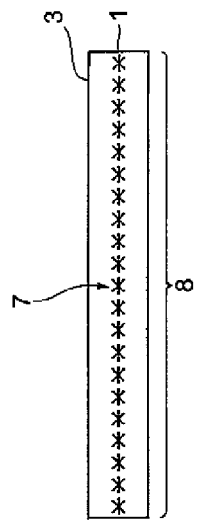
FIG. 6 is a sectional view of the object taken along the line VI-VI of FIG. 4.
Figure 5:
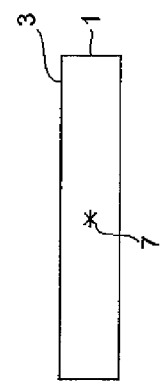
FIG. 5 is a sectional view of the object taken along the line V-V of FIG. 4.

As shown in FIG. 2, the line to cut 5 for cutting the planar object 1 is set therein. The line to cut 5 is a virtual line extending straight. When forming a modified region within the object 1, the laser light L is relatively moved along the line to cut 5 (i.e., in the direction of arrow A in FIG. 2) while locating a converging point P within the object 1 as shown in FIG. 3. This forms a modified region 7 within the object 1 along the line to cut 5 as shown in FIGS. 4 to 6, whereby the modified region 7 formed along the line to cut 5 becomes a starting point region for cutting 8.

The converging point P is a position at which the laser light L is converged. The line to cut 5 may be curved instead of being straight, and may be a line actually drawn on the front face 3 of the object 1 without being restricted to the virtual line. The modified region 7 may be formed either continuously or intermittently. It will be sufficient if the modified region 7 is formed at least within the object 1. There are cases where fractures are formed from the modified region 7 acting as a start point, and the fractures and modified region 7 may be exposed at outer surfaces (the front face, rear face, and outer peripheral face) of the object 1.

Here, the laser light L is absorbed in particular in the vicinity of the converging point within the object 1 while being transmitted therethrough, whereby the modified region 7 is formed in the object 1 (i.e., laser processing of internal absorption type). Hence, the front face 3 of the object 1 hardly absorbs the laser light L and thus does not melt. In the case of forming a removed part such as hole or groove by melting and removing from the front face 3 (laser processing of surface absorption type), the processed region gradually advances from the front face 3 side to the rear face side in general.

The modified region formed by the object cutting methods in accordance with the embodiments refers to regions whose physical characteristics such as density, refractive index, and mechanical strength have attained states different from those of their surroundings. Examples of the modified region include (1) molten processed regions, (2) crack regions or dielectric breakdown regions, (3) refractive index changed regions, and their mixed regions.

The modified region in the object cutting methods in accordance with the embodiments is formed by local absorption of laser light or a phenomenon known as multiphoton absorption. A material becomes transparent when its absorption bandgap $E_G$ is greater than photon energy hv, so that a condition under which absorption occurs in the material is $hv > E_G$. However, even when optically transparent, the material generates absorption under a condition of $nhv > E_G$ (where $n=2, 3, 4, \ldots$) if the intensity of laser light becomes very high. This phenomenon is known as multiphoton absorption. The forming of a molten processed region by multiphoton absorption is disclosed, for example, in "Silicon Processing Characteristic Evaluation by Picosecond Pulse Laser", Preprints of the National Meetings of Japan Welding Society, Vol. 66 (April, 2000), pp. 72-73.

Also, modified regions formed by employing ultrashort-pulse laser light having a pulse width of several picoseconds to femtoseconds may be utilized as described in D. Du, X. Liu, G. Korn, J. Squier, and G. Mourou, "Laser Induced Breakdown by Impact Ionization in $SiO_2$ with Pulse Widths from 7 ns to 150 fs", Appl. Phys. Lett. 64(23), Jun. 6, 1994.

(1) Case Where the Modified Region Includes a Molten Processed Region

An object to be processed (e.g., semiconductor material such as silicon) is irradiated with the laser light L while locating a converging point within the object under a condition with a field intensity of at least $1 \times 10^8$ (W/cm$^2$) at the converging point and a pulse width of 1 µs or less. As a consequence, the laser light L is absorbed in the vicinity of the converging point, so that the inside of the object is locally heated, and this heating forms a molten processed region within the object.

The molten processed region encompasses regions once molten and then re-solidified, regions just in a molten state, and regions in the process of being re-solidified from the molten state, and can also be referred to as a region whose phase has changed or a region whose crystal structure has changed. The molten processed region may also be referred to as a region in which a certain structure changes to another structure among monocrystal, amorphous, and polycrystal structures. For example, it means a region having changed from the monocrystal structure to the amorphous structure, a region having changed from the monocrystal structure to the polycrystal structure, or a region having changed from the monocrystal structure to a structure containing amorphous and polycrystal structures. When the object to be processed is of a silicon monocrystal structure, the molten processed region is an amorphous silicon structure, for example.

Figure 7:
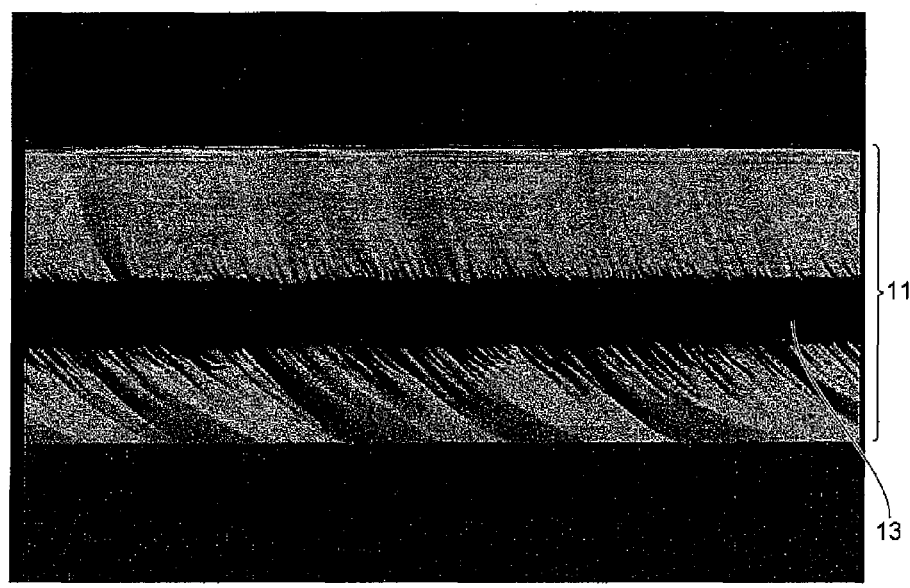
FIG. 7 is a view showing a photograph of a cut section of a silicon wafer after the laser processing.

FIG. 7 is a view showing a photograph of a cross section in a part of a silicon wafer (semiconductor substrate) irradiated with laser light. As shown in FIG. 7, a molten processed region 13 is formed within the semiconductor substrate 11.

Figure 8:
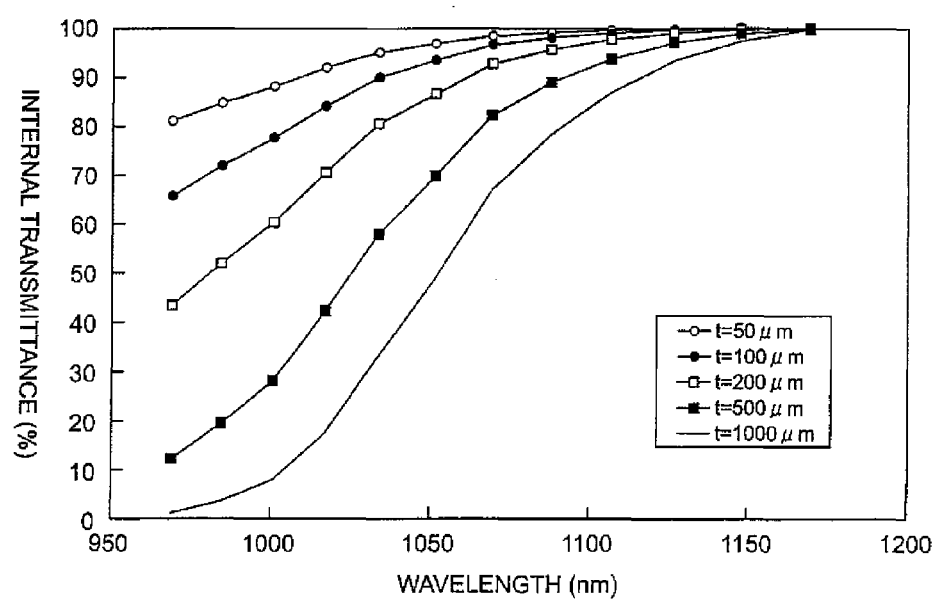
FIG. 8 is a graph showing relationships between the laser light wavelength and the transmittance within a silicon substrate.

The fact that the molten processed region 13 is formed within a material transparent to the wavelength of laser light incident thereon will now be explained. FIG. 8 is a graph showing relationships between the laser light wavelength and the transmittance within the silicon substrate. Here, the respective reflected components on the front and rear face sides of the silicon substrate are eliminated, so as to show the internal transmittance alone. The respective relationships are shown in the cases where the thickness t of the silicon substrate is 50 µm, 100 µm, 200 µm, 500 µm, and 1000 µm.

For example, at the Nd:YAG laser wavelength of 1064 nm, the laser light L appears to be transmitted through the silicon substrate by at least 80% when the silicon substrate has a thickness of 500 µm or less. Since the semiconductor substrate 11 shown in FIG. 7 has a thickness of 350 µm, the molten processed region 13 caused by multiphoton absorption is formed near the center of the semiconductor substrate 11, i.e., at a part distanced from the front face by 175 µm. The transmittance in this case is 90% or more with reference to a silicon wafer having a thickness of 200 µm, whereby the laser light L is absorbed only slightly within the semiconductor substrate 11 but is substantially transmitted therethrough. When converged within the silicon wafer under the condition of at least $1 \times 10^8$ (W/cm$^2$) with a pulse width of 1 µs or less, however, the laser light L is locally absorbed at the converging point and its vicinity, whereby the molten processed region 13 is formed within the semiconductor substrate 11.

There is a case where fractures occur in the silicon wafer from the molten processed region acting as a start point. There is also a case where fractures are formed as being incorporated in the molten processed region. In the latter case, the fractures may be formed over the whole surface of the molten processed region or in only a part or a plurality of parts thereof. These fractures may grow naturally or as a force is exerted on the silicon wafer. The fractures naturally growing from the molten processed region include both of cases where they grow from a state in which the molten processed region is molten and where they grow when the molten processed region is re-solidified from the molten state. In either case, the molten processed region is formed only within the silicon wafer and, when at a cut section, within the cut section as shown in FIG. 7.

(2) Case Where the Modified Region Includes a Crack Region

An object to be processed (e.g., glass or a piezoelectric material made of LiTaO$_3$) is irradiated with the laser light L while locating a converging point therewithin under a condition with a field intensity of at least $1\times10^8$ (W/cm$^2$) at the converging point and a pulse width of 1 µs or less. This magnitude of pulse width is a condition under which the laser light L is absorbed within the object so that a crack region is formed therein. This generates a phenomenon of optical damage by multiphoton absorption within the object. This optical damage induces a thermal distortion within the object, thereby forming a crack region including a crack or a plurality of cracks within the object. The crack region may also be referred to as a dielectric breakdown region.

Figure 9:
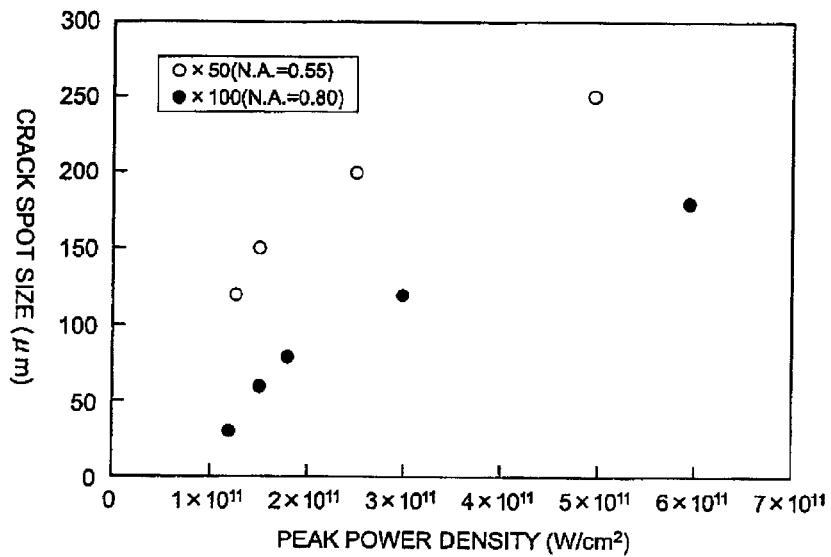
FIG. 9 is a graph showing relationships between the peak power density of laser light and crack spot size.

FIG. 9 is a graph showing results of experiments concerning relationships between the field intensity and crack size. The abscissa indicates the peak power density. Since the laser light L is pulsed laser light, the field intensity is represented by the peak power density. The ordinate indicates the size of a crack part (crack spot) formed within the object by one pulse of laser light L. Crack spots gather to yield a crack region. The crack spot size is the size of a part yielding the maximum length among forms of crack spots. Data represented by black circles in the graph refer to a case where the condenser lens (C) has a magnification of ×100 and a numerical aperture (NA) of 0.80. On the other hand, data represented by whitened circles in the graph refer to a case where the condenser lens (C) has a magnification of ×50 and a numerical aperture (NA) of 0.55. Crack spots are seen to occur within the object from when the peak power density is about $10^{11}$ (W/cm$^2$) and become greater as the peak power density increases.

(3) Case Where the Modified Region Includes a Refractive Index Changed Region

An object to be processed (e.g., glass) is irradiated with the laser light L while locating a converging point within the object under a condition with a field intensity of at least $1\times10^8$ (W/cm$^2$) at the converging point and a pulse width of 1 ns or less. When the laser light L is absorbed within the object while having such a very short pulse width, its energy is not converted into thermal energy, whereby an eternal structure change such as ion valence change, crystallization, or orientation polarization is induced within the object, thus forming a refractive index changed region.

The modified region, which encompasses the molten processed regions, dielectric breakdown regions, refractive index changed regions, and their mixed regions, may be an area where the density of the modified region has changed from that of an unmodified region in the material or an area formed with a lattice defect. They can collectively be referred to as a high-density transitional region.

The molten processed regions, refractive index changed regions, areas where the modified region has a density different from that of the unmodified region, or areas formed with a lattice defect may further include a fracture (cut or microcrack) therewithin or at an interface between the modified and unmodified regions. The included fracture may be formed over the whole surface of the modified region or in only a part or a plurality of parts thereof The object can be cut with a favorable precision if the modified region is formed as follows while taking account of the crystal structure of the object, its cleavage characteristic, and the like.

Namely, in the case of a substrate made of a monocrystal semiconductor having a diamond structure such as silicon, it will be preferred if the modified region is formed in a direction extending along a (111) plane (first cleavage plane) or a (110) plane (second cleavage plane). In the case of a substrate made of a group III-V compound semiconductor of sphalerite structure such as GaAs, it will be preferred if the modified region is formed in a direction extending along a (110) plane. In the case of a substrate having a crystal structure of hexagonal system such as sapphire (Al$_2$O$_3$), it will be preferred if the modified region is formed in a direction extending along a (1120) plane (A plane) or a (1100) plane (M plane) while using a (0001) plane (C plane) as a principal plane.

When the substrate is formed with an orientation flat in a direction to be formed with the above-mentioned modified region (e.g., a direction extending along a (111) plane in a monocrystal silicon substrate) or a direction orthogonal to the direction to be formed therewith, the modified region can be formed easily and accurately in the substrate with reference to the orientation flat.

The object cutting methods in accordance with the embodiments will now be explained.

First Embodiment

Figure 10:
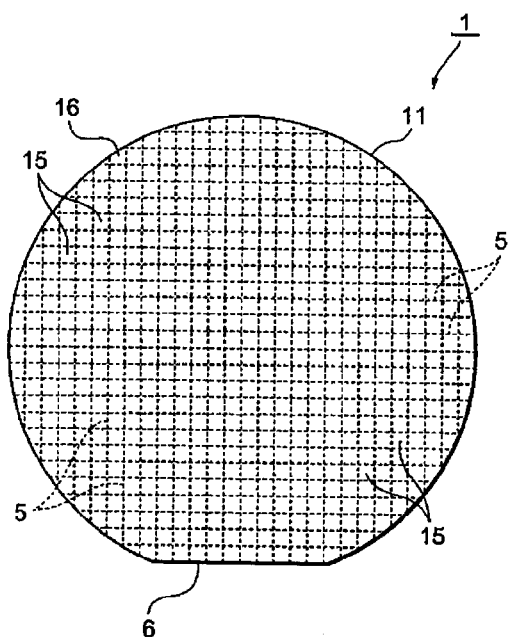
FIG. 10 is a plan view of an object to be processed for which the object cutting method in accordance with a first embodiment is employed.
Figure 11:
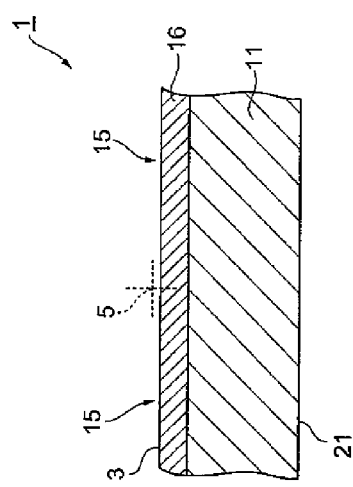
FIG. 11 is a sectional view of a part of the object of FIG. 10 taken along a line to cut.

FIG. 10 is a plan view of an object to be processed for which the object cutting method in accordance with the first embodiment is employed, while FIG. 11 is a sectional view of a part of the object of FIG. 10 taken along a line to cut. As shown in FIGS. 10 and 11, a planar object to be processed 1 comprises a silicon wafer (semiconductor substrate) 11 and a functional device layer 16, formed on a main face of the silicon wafer 11, including a plurality of functional devices 15. A number of functional devices 15, examples of which include semiconductor operating layers formed by crystal growth, light-receiving devices such as photodiodes, light-emitting devices such as laser diodes, and circuit devices formed as circuits, are formed like a matrix in directions parallel and perpendicular to an orientation flat 6 of the silicon wafer 11 in the first embodiment.

The object cutting method in accordance with the first embodiment is employed for the object 1 constructed as mentioned above.

Figure 12:
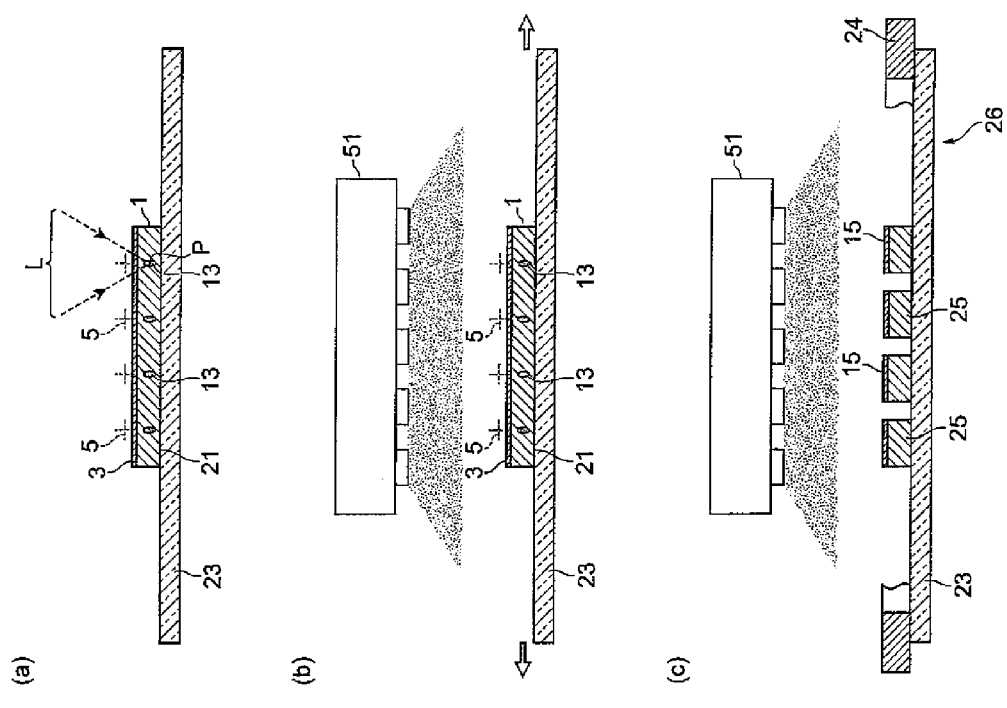
FIG. 12 is a sectional view of a part of the object for explaining the object cutting method in accordance with the first embodiment.

First, as shown in FIG. 12(a), an expandable tape (first sheet) 23 is attached to the rear face 21 of the object 1. Subsequently, the object 1 is secured onto a support table of a laser processing apparatus (not shown) such that the functional device layer 16 faces up. Then, as shown in FIG. 10, lines to cut 5 passing between the functional devices 15, 15 adjacent to each other are set like grids in directions perpendicular and parallel to the orientation flat 6.

Next, the object 1 is irradiated with the laser light L while using its front face 3 as a laser light entrance surface and locating a converging point P within the silicon wafer 11, and the support table is moved, such that the converging point P relatively shifts along each of the lines to cut 5 set like grids in the directions perpendicular and parallel to the orientation flat 6. This forms one row of molten processed region 13 within the silicon wafer 11 for each line to cut 5. At this time, fractures may occur from the molten processed region 13 so as to reach the front face 3 or rear face 21 of the object 1. The molten processed region 13 may include cracks mixed therein.

The number of rows of molten processed regions 13 formed within the silicon wafer 11 for each line to cut 5 varies depending on the thickness of the silicon wafer 11 and the like, and may be a plural without being restricted to 1. When forming a plurality of rows of molten processed regions 13 within the silicon wafer 11 for one line to cut 5, the relative movement of the converging point P along each line to cut 5 is conducted a plurality of times for the line to cut 5. Here, for each line to cut 5, a plurality of rows of molten processed regions 13 are formed one by one successively from the rear face 21 side with respective distances from the front face 3 to the position at which the converging point P is focused.

Next, as shown in FIG. 12(b), the expandable tape 23 is expanded, while an ion generator 51 generates a dischargeable ion flow (e.g., an ion flow including positive and negative ions) so as to destaticize the object 1 and expandable tape 23. As a consequence, the object 1 is cut along the lines to cut 5 from the molten processed regions 13 acting as cutting start points, whereby a number of semiconductor chips 25 each having one functional device 15 are obtained as shown in FIG. 12(c). At this time, the expandable tape 23 is in its expanded state, whereby the semiconductor chips 25 are separated from each other. For keeping this state, a ring-shaped frame 24 is secured to the peripheral part of the expandable tape 23, so as to construct a semiconductor chip supporting unit 26.

If forming materials of the object 1 (the object 1 formed with the molten processed region 13, the semiconductor chips 25 obtained by cutting the object 1, particles peeled off from cut sections of the semiconductor chips 25, and the like) and the expandable tape 23 are destaticized at the time of expanding the expandable tape 23, the particles peeled off from the cut sections of the semiconductor chips 25 will fall onto the expandable tape 23 without dispersing randomly. This can reliably prevent the particles from attaching to the functional devices 15 of the semiconductor chips 25 at the time of expanding the expandable tape 23.

Next, as shown in FIG. 13(a), the semiconductor chip supporting unit 26 is supported such that the expandable tape 23 faces up (i.e., the semiconductor chips 25 and expandable tape 23 are positioned such that the expandable tape 23 is located higher than the semiconductor chips 25 in the vertical direction), and an adsorption tape (second sheet) 27 is arranged such as to oppose the expandable tape 23 while holding the semiconductor chips 25 therebetween. Then, as shown in FIG. 13(b), an ion generator 52 arranged aside generates a dischargeable ion flow (second ion flow) in an area between the semiconductor chips 25 and adsorption tape 27. Here, the dischargeable ion flow generated by the ion generator 52 may extend to the semiconductor chips 25.

Subsequently, as shown in FIG. 14(a), an ion generator 53 generates a chargeable ion flow (first ion flow; e.g., an ion flow including a positive or negative ion), so that the expandable tape 23 is irradiated therewith from the upper side and electrically charged, in the state where the dischargeable ion flow is generated in the area between the semiconductor chips 25 and adsorption tape 27 by the ion generator 52 while the semiconductor chips 25 are separated from each other on the expandable tape 23. When the expandable tape 23 is thus irradiated with the chargeable ion flow from a side of the expandable tape 23 opposite from the side arranged with the semiconductor chips 25, the whole surface of the expandable tape 23 can reliably be charged electrically. The expandable tape 23 may be charged either positive or negative. The amount of charge is 4 kV/inch, for example, while the charging time is 1 second (or may be instantaneous as long as the tape can be charged), for example.

Figure 15:
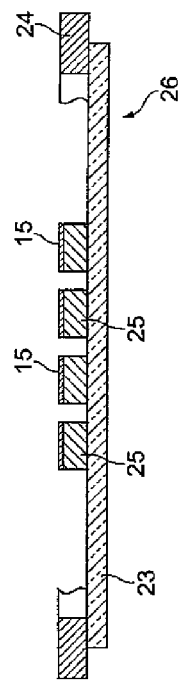
FIG. 15 is a sectional view of a part of the object for explaining the object cutting method in accordance with the first embodiment.

As a consequence, the particles failing to peel off from the cut sections of the semiconductor chips 25 and remaining there eject therefrom. As shown in FIG. 14(b), the ejected particles are destaticized by the ion flow generated by the ion generator 52, so as to fall onto the adsorption tape 27 under the influence of gravity. Then, the semiconductor chips 25 are manufactured as shown in FIG. 15.

As the ion generators 51, 52, destaticizers of soft x-ray irradiation type and corona discharge type can be used, for example. As the ion generator 53, corona discharge guns and corona discharge bars which generate positive or negative ions can be used, for example.

In the object cutting method in accordance with the first embodiment, as explained in the foregoing, the expandable tape 23 is electrically charged in the state where a plurality of semiconductor chips 25 obtained by cutting the planar object 1 along the lines to cut 5 are separated from each other on the expandable tape 23. This electric action causes the particles remaining on the cut sections of the semiconductor chips 25 to eject therefrom even when the molten processed region 13 is formed therein. At this time, the particles ejected from the cut sections of the semiconductor chips 25 fall under their own weight, since the semiconductor chips 25 and expandable tape 23 are positioned such that the expandable tape 23 is located higher than the semiconductor chips 25 in the vertical direction. Therefore, the object cutting method in accordance with the first embodiment can reliably remove the particles remaining on the cut sections of the semiconductor chips 25.

Also, in the object cutting method in accordance with the first embodiment, the adsorption tape 27 is arranged such as to oppose the expandable tape 23 while holding the semiconductor chips 25 therebetween, and a dischargeable ion flow is generated between the semiconductor chips 25 and adsorption tape 27. As a consequence, the particles ejected from the cut sections of the semiconductor chips 25 attach to the adsorption tape 27. Therefore, the object cutting method in accordance with the first embodiment can reliably prevent the particles ejected from the cut sections of the semiconductor chips 25 from attaching to the functional devices 15 of the semiconductor chips 25.

Experimental results will now be explained. A silicon wafer shaped into a thin square sheet having an outer form of 50 mm×50 mm with a thickness of 625 mm was cut into a plurality of chips each having an outer form of 2 mm×2 mm with a thickness of 625 mm. When the expandable tape was electrically charged with an amount of charge of +3.8 kV/inch here, the amount of particles generated, which had been 0 before charging, became 225. When the expandable tape was electrically charged with an amount of charge of −3.8 kV/inch, on the other hand, the amount of particles generated, which had been 0 before charging, became 210. This has proved that the expandable tape may be electrically charged either positive or negative. The following is assumed to be the reason why either positive or negative charges can eject the particles. Namely, it seems that, when the expandable tape is electrically charged, the particles (of silicon dust) are charged to the same polarity together with the chips, so that a repulsive force due to static electricity is generated between the chips and particles, whereby the particles eject.

Second Embodiment

The second embodiment is the same as the first embodiment up to the step of constructing the semiconductor chip supporting unit 26.

Figure 16:
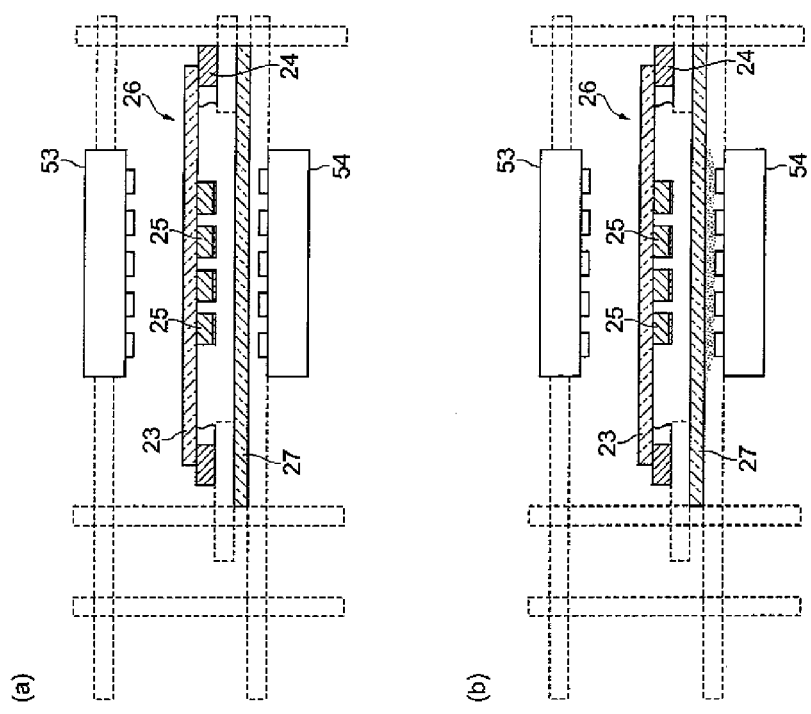
FIG. 16 is a sectional view of a part of an object to be processed for explaining the object cutting method in accordance with a second embodiment.

After being constructed, the semiconductor chip supporting unit 26 is supported such that the expandable tape 23 faces up (i.e., the semiconductor chips 25 and expandable tape 23 are positioned such that the expandable tape 23 is located higher than the semiconductor chips 25 in the vertical direction) as shown in FIG. 16(a), and the adsorption tape (second sheet) 27 is arranged such as to oppose the expandable tape 23 while holding the semiconductor chips 25 therebetween. Then, as shown in FIG. 16(b), an ion generator 54 generates a chargeable ion flow (second ion flow; e.g., an ion flow including a positive or negative ion), so that the adsorption tape 27 is irradiated therewith from the lower side and electrically charged.

Figure 17:
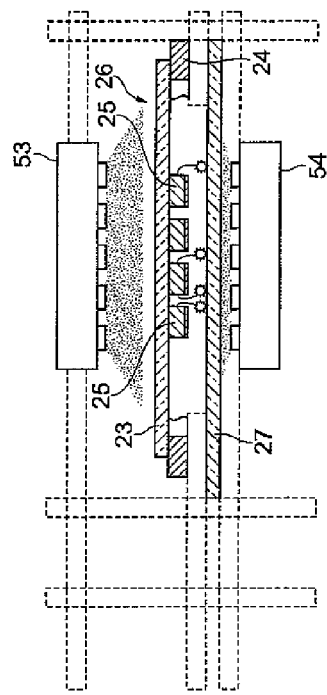
FIG. 17 is a sectional view of a part of the object for explaining the object cutting method in accordance with the second embodiment.

Subsequently, as shown in FIG. 17, the ion generator 53 generates a chargeable ion flow (first ion flow; e.g., an ion flow including a positive or negative ion), so that the expandable tape 23 is irradiated therewith from the upper side and electrically charged, in the state where the adsorption tape 27 is irradiated with the chargeable ion flow by the ion generator 54 while the semiconductor chips 25 are separated from each other on the expandable tape 23. When the expandable tape 23 is thus irradiated with the chargeable ion flow from a side of the expandable tape 23 opposite from the side arranged with the semiconductor chips 25, the whole surface of the expandable tape 23 can reliably be charged electrically. Here, the ion flow generated by the ion generator 54 is one chargeable to the polarity opposite from that of the ion flow generated by the ion generator 53. The amount of charge of the adsorption tape 27 has an absolute value greater than that of the amount of charge of the expandable tape 23.

Figure 18:
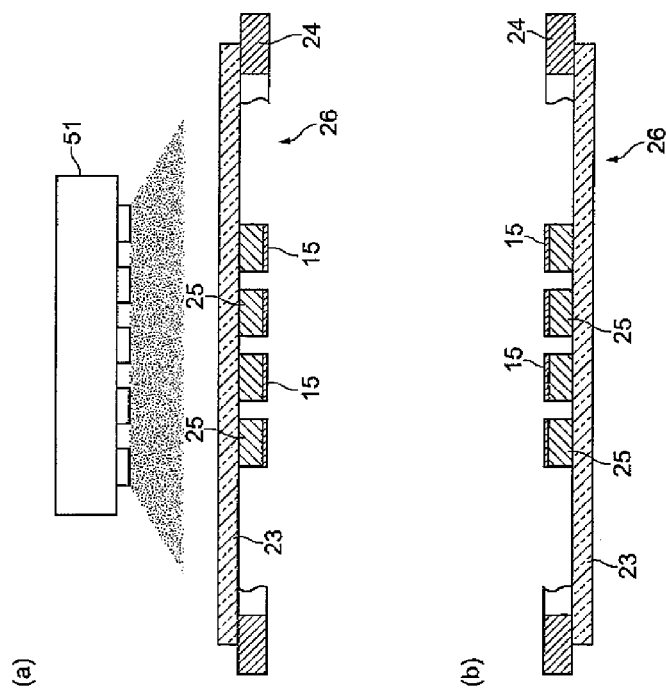
FIG. 18 is a sectional view of a part of the object for explaining the object cutting method in accordance with the second embodiment.

As a consequence, the particles failing to peel off from the cut sections of the semiconductor chips 25 and remaining there eject therefrom. The ejected particles fall under the influence of gravity and are adsorbed by the adsorption tape 27 electrically charged by the ion flow generated by the ion generator 54. Subsequently, as shown in FIG. 18(a), the ion generator 51 generates a dischargeable ion flow, so as to destaticize the semiconductor chip supporting unit 26. Hence, the semiconductor chips 25 are manufactured as shown in FIG. 18(b).

As explained in the foregoing, the object cutting method in accordance with the second embodiment can reliably remove the particles remaining on the cut sections of the semiconductor chips 25 as with the object cutting method in accordance with the first embodiment.

In the object cutting method in accordance with the second embodiment, the adsorption tape 27 is arranged such as to oppose the expandable tape 23 while holding the semiconductor chips 25 therebetween, and an ion flow chargeable to the polarity opposite from that of the chargeable ion flow emitted to the expandable tape 23 irradiates the adsorption tape 27. As a consequence, the particles ejected from the cut sections of the semiconductor chips 25 attach to the adsorption tape 27. Therefore, the object cutting method in accordance with the second embodiment can reliably prevent the particles ejected from the cut sections of the semiconductor chips 25 from attaching to the functional devices 15 of the semiconductor chips 25.

Third Embodiment

In the third embodiment, the object to be processed 1 is a so-called MEMS wafer. A number of functional devices 15, examples of which include mechanical element members, sensors, actuators, and electronic circuits, are formed like a matrix in directions parallel and perpendicular to the orientation flat 6 of the silicon wafer 11.

First, as shown in FIG. 19(a), an expandable tape (first sheet) 23 is attached to the rear face 21 of the object 1. Subsequently, the object 1 is secured onto a support table of a laser processing apparatus (not shown) such that the functional device layer 16 faces up. Then, as shown in FIG. 10, lines to cut 5 passing between the functional devices 15, 15 adjacent to each other are set like grids in directions perpendicular and parallel to the orientation flat 6.

Next, the object 1 is irradiated with the laser light L while using its front face 3 as a laser light entrance surface and locating the converging point P within the silicon wafer 11, and the support table is moved, such that the converging point relatively shifts along each of the lines to cut 5 set like grids in the directions perpendicular and parallel to the orientation flat 6. This forms one row of molten processed region 13 within the silicon wafer 11 for each line to cut 5.

Subsequently, as shown in FIG. 19(b), a protective tape (second sheet) 28, which is provided with protection holes 28a corresponding to the respective functional devices 15 in order to prevent the functional devices 15 from breaking, is attached to the front face 3 of the object 1 and expanded together with the expandable tape 23. As a consequence, the object 1 is cut along the lines to cut 5 from the molten processed regions 13 acting as cutting start points, whereby a number of semiconductor chips 25 each having one functional device 15 are obtained as shown in FIG. 19(c). At this time, the expandable tape 23 and protective tape 28 are in their expanded state, whereby the semiconductor chips 25 are separated from each other. For keeping this state, the ring-shaped frame 24 is secured between peripheral parts of the expandable tape 23 and protective tape 28, so as to construct a semiconductor chip supporting unit 29.

Next, as shown in FIG. 20(a), the semiconductor chip supporting unit 29 is supported such that the expandable tape 23 faces up (i.e., the semiconductor chips 25 and expandable tape 23 are positioned such that the expandable tape 23 is located higher than the semiconductor chips 25 in the vertical direction). Then, as shown in FIG. 20(b), the ion generator 53 generates a chargeable ion flow (first ion flow; e.g., an ion flow including a positive or negative ion), so that the expandable tape 23 is irradiated therewith from the upper side and electrically charged, in the state where the semiconductor chips 25 are separated from each other on the expandable tape 23 while the protective tape 28 covering the gaps between the semiconductor chips 25, 25 is arranged such as to oppose the expandable tape 23 with the semiconductor chips 25 interposed therebetween. When the expandable tape 23 is thus irradiated with the chargeable ion flow from a side of the expandable tape 23 opposite from the side arranged with the semiconductor chips 25, the whole surface of the expandable tape 23 can reliably be charged electrically.

Figure 21:
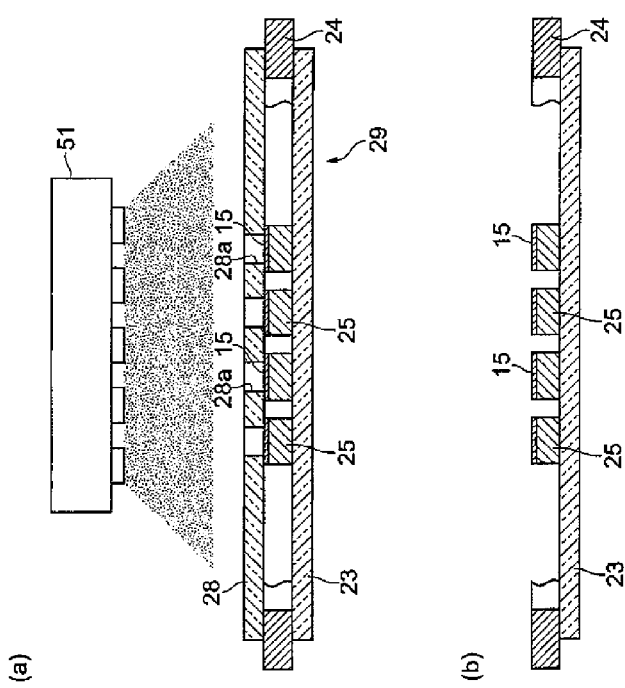
FIG. 21 is a sectional view of a part of the object for explaining the object cutting method in accordance with the third embodiment.

As a consequence, the particles failing to peel off from the cut sections of the semiconductor chips 25 and remaining there eject therefrom. The ejected particles fall onto the protective tape 28 under the influence of gravity. Subsequently, as shown in FIG. 21(a), the ion generator 51 generates a dischargeable ion flow, so as to destaticize the semiconductor chip supporting unit 29. Then, the protective tape 28 is removed, whereby, the semiconductor chips 25 are manufactured as shown in FIG. 21(b).

As explained in the foregoing, the object cutting method in accordance with the third embodiment can reliably remove the particles remaining on the cut sections of the semiconductor chips 25 as with the object cutting method in accordance with the first embodiment.

In the object cutting method in accordance with the third embodiment, the expandable tape 23 is irradiated with the chargeable ion flow in the state where the semiconductor chips 25 are separated from each other on the expandable tape 23 while the protective tape 28 covering the gaps between the semiconductor chips 25, 25 is arranged such as to oppose the expandable tape 23 with the semiconductor chips 25 interposed therebetween. As a consequence, the particles ejected from the cut sections of the semiconductor chips 25 attach to the protective tape 28. Therefore, the object cutting method in accordance with the third embodiment can reliably prevent the particles ejected from the cut sections of the semiconductor chips 25 from attaching to the functional devices 15 of the semiconductor chips 25.

Figure 22:
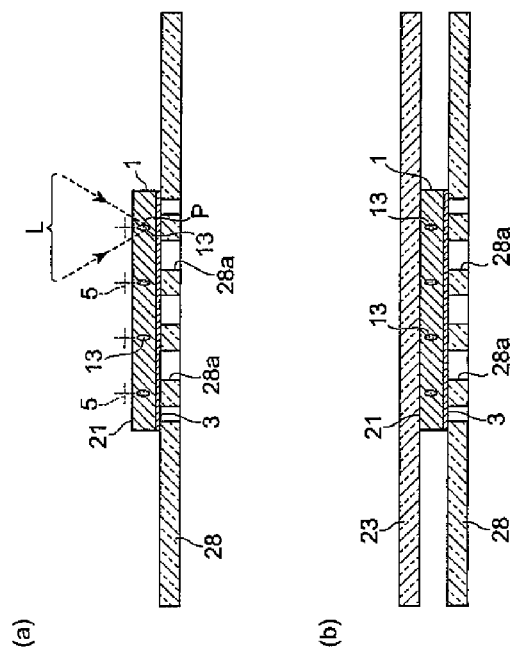
FIG. 22 is a sectional view of a part of the object for explaining the object cutting method in accordance with the third embodiment.
Figure 24:
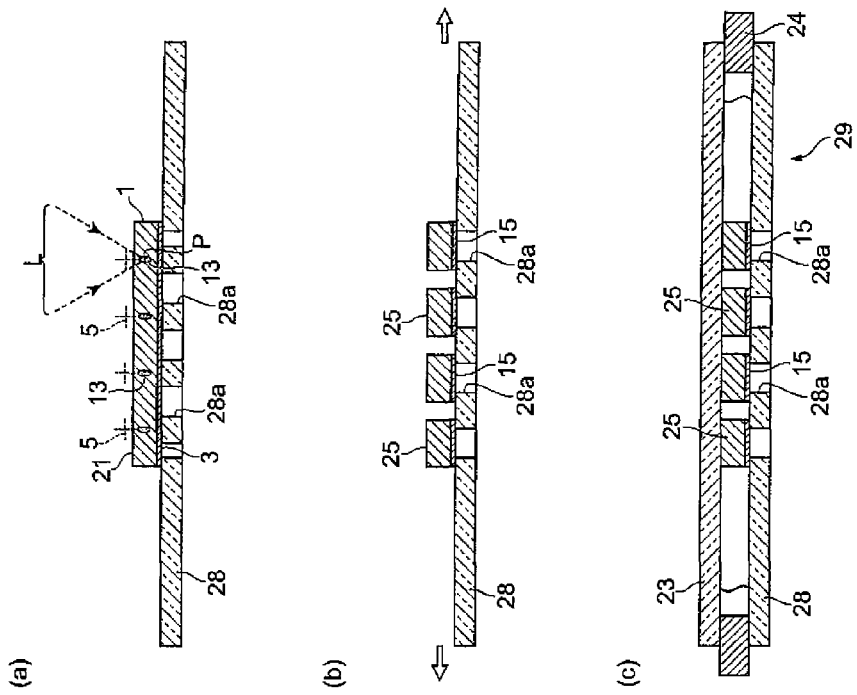
FIG. 24 is a sectional view of a part of the object for explaining the object cutting method in accordance with the third embodiment.
Figure 23:
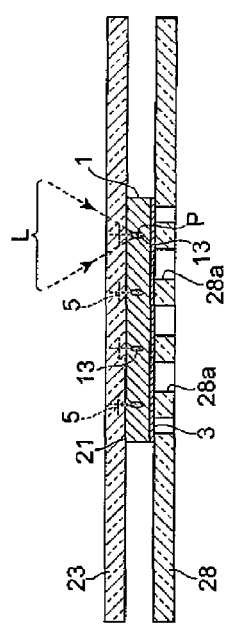
FIG. 23 is a sectional view of a part of the object for explaining the object cutting method in accordance with the third embodiment.

The molten processed regions 13 may be formed while using the rear face 21 of the object 1 as the laser light entrance surface in the state where the protective tape 28 is attached to the front face 3 of the object 1 as shown in FIG. 22(a), and then the expandable tape 23 may be attached to the rear face 21 of the object 1 as shown in FIG. 22(b). When the expandable tape 23 is transparent to the laser light L, the molten processed regions 13 may be formed while using the rear face 21 of the object 1 as the laser light entrance surface in the state where the protective tape 28 is attached to the front face 3 of the object 1 while the expandable tape 23 is attached to the rear face 21 of the object 1 as shown in FIG. 23. The molten processed regions 13 may be formed while using the rear face 21 of the object 1 as the laser light entrance surface in the state where the protective tape 28 is attached to the front face 3 of the object 1 as shown in FIG. 24(a), the object 1 may be cut into a number of semiconductor chips 25 by expanding the protective tape 28 as shown in FIG. 24(b), and then the expandable tape 23 may be attached to the rear face 21 of the object 1 as shown in FIG. 24(c).

Fourth Embodiment

The fourth embodiment is the same as the first embodiment up to the step of constructing the semiconductor chip supporting unit 26.

Figure 25:
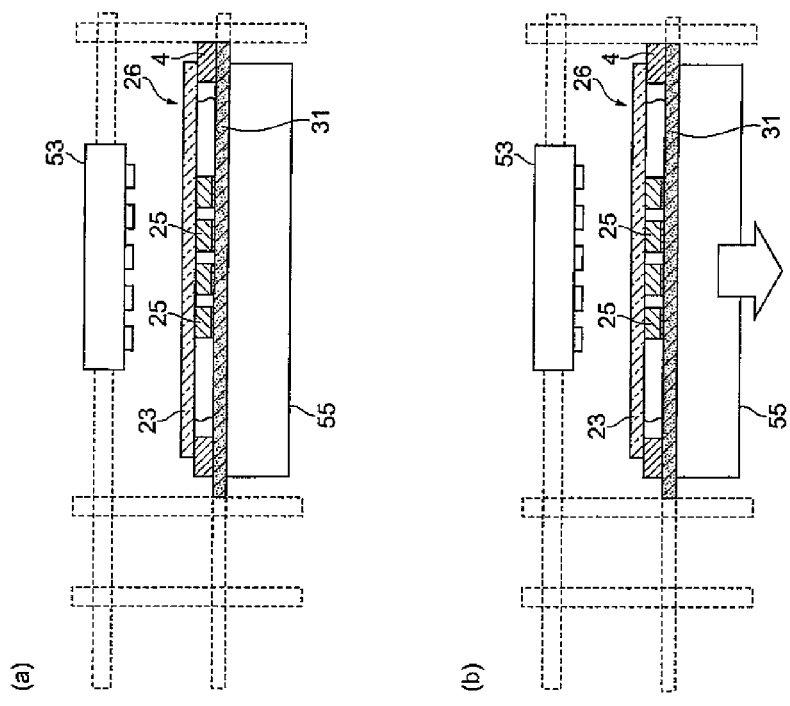
FIG. 25 is a sectional view of a part of an object to be processed for explaining the object cutting method in accordance with a fourth embodiment.

After being constructed, the semiconductor chip supporting unit 26 is arranged on a porous sheet (second sheet) 31 placed on an aspirator 55 such that the expandable tape 23 faces up (i.e., the semiconductor chips 25 and expandable tape 23 are positioned such that the expandable tape 23 is located higher than the semiconductor chips 25 in the vertical direction) as shown in FIG. 25(a). The porous sheet 31 preferably has functions of protecting the functional devices 15 and adsorbing particles. Though the semiconductor chips 25 are totally covered in the fourth embodiment, it will be sufficient if the gaps between the semiconductor chips 25, 25 are covered.

Figure 26:
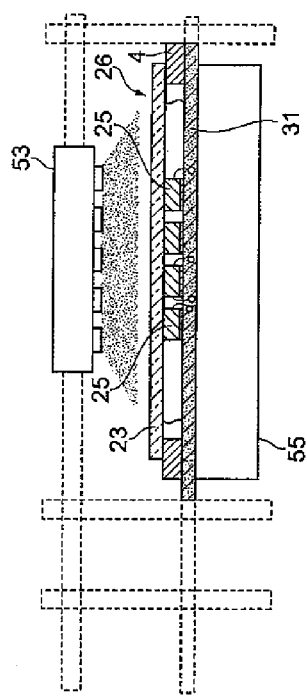
FIG. 26 is a sectional view of a part of the object for explaining the object cutting method in accordance with the fourth embodiment.

Next, as shown in FIG. 25(b), the aspirator 55 aspirates at least the gaps between the semiconductor chips 25, 25 through the porous sheet 31. At this time, as shown in FIG. 26, the ion generator 53 generates a chargeable ion flow (first ion flow; e.g., an ion flow including a positive or negative ion), so that the expandable tape 23 is irradiated therewith from the upper side and electrically charged, in the state where the semiconductor chips 25 are separated from each other on the expandable tape 23 while the porous sheet 31 covering at least the gaps between the semiconductor chips 25, 25 is arranged such as to oppose the expandable tape 23 with the semiconductor chips 25 interposed therebetween. When the expandable tape 23 is thus irradiated with the chargeable ion flow from a side of the expandable tape 23 opposite from the side arranged with the semiconductor chips 25, the whole surface of the expandable tape 23 can reliably be charged electrically.

As a consequence, the particles failing to peel off from the cut sections of the semiconductor chips 25 and remaining there eject therefrom. The ejected particles fall under the influence of gravity and are adsorbed by the porous sheet 31 because of the aspirating action by the aspirator 55. Subsequently, as in the second embodiment, the ion generator 51 generates a dischargeable ion flow, so as to destaticize the semiconductor chip supporting unit 26. Hence, the semiconductor chips 25 are manufactured.

As explained in the foregoing, the object cutting method in accordance with the fourth embodiment can reliably remove the particles remaining on the cut sections of the semiconductor chips 25 as with the object cutting method in accordance with the first embodiment.

In the object cutting method in accordance with the fourth embodiment, in the state where the semiconductor chips 25 are separated from each other on the expandable tape 23 while the porous sheet 31 covering at least the gaps between the semiconductor chips 25, 25 is arranged such as to oppose the expandable tape 23 with the semiconductor chips 25 interposed therebetween, the expandable tape 23 is irradiated with the chargeable ion flow while at least the gaps between the semiconductor chips 25, 25 are aspirated through the porous sheet 31. As a consequence, the particles ejected from the cut sections of the semiconductor chips 25 attach to the porous sheet 31. Therefore, the object cutting method in accordance with the fourth embodiment can reliably prevent the particles ejected from the cut sections of the semiconductor chips 25 from attaching to the functional devices 15 of the semiconductor chips 25.

The present invention is not limited to the above-mentioned first to fourth embodiments.

For example, though the expandable tape 23 is electrically charged by irradiating it with a chargeable ion flow in each of the above-mentioned embodiments, the expandable tape 23 may be electrically charged by peeling off another tape from the expandable tape 23, rubbing a jig against the expandable tape 23, or bringing an electrically charged substance into contact with the expandable tape 23.

When the semiconductor chips 25 and expandable tape 23 are positioned such that the expandable tape 23 is located higher than the semiconductor chips 25 in the vertical direction, it is unnecessary for the adsorption tape 27, protective tape 28, porous sheet 31, or the like to be arranged such as to oppose the expandable tape 23 while holding the semiconductor chips 25 therebetween. This is because the particles ejected from the cut sections of the semiconductor chips 25 fall under their own weight, whereby the particles remaining on the cut sections of the semiconductor chips 25 are reliably removed.

Though the molten processed regions are formed within the semiconductor substrate in the object to be processed in each of the above-mentioned embodiments, other modified regions such as crack regions and refractive index changed regions may be formed within objects to be processed made of other materials such as glass and piezoelectric materials.

Other techniques for preventing particles from attaching onto chips under the action of charging at the time of cutting when expanding the expandable tape in the cutting step (i.e., the step of irradiating the object with laser light, so as to form a modified region in the object along a line to cut, and cutting the object into chips from the modified region acting as a cutting start point) will now be explained.

FIG. 27 is a table showing changes in the amount of charge in an expandable tape and changes in the amount of dust on chips when using a columnar expander.

First, as shown in FIG. 27(a), the expandable tape 23 is attached to the rear face of the object 1, and a ring-shaped frame 32 is secured to the peripheral part of the expandable tape 23. Then, as shown in FIG. 27(b), the object 1 is irradiated with laser light while using the front face of the object 1 as the laser light entrance surface and locating a converging point within the object 1, so as to form a modified region 7 within the object 1 along a line to cut 5.

Subsequently, as shown in FIG. 27(c), the frame 32 is fixed in the state where the expandable tape 23 is placed on a columnar expander 33 made of a metal. Then, as shown in FIG. 27(d), the expander 33 is moved up relative to the frame 32, so as to expand the expandable tape 23. As a consequence, the object is cut into chips 25 from the modified region 7 acting as a cutting start point, whereby the chips 25 are separated from each other.

Next, as shown in FIG. 27(e), the ring-shaped frame 24 is secured to the expandable tape 23 on the inside of the frame 32 in the state where the expandable tape 23 is expanded, and the expandable tape 23 is cut on the outside of the frame 24, so as to construct the chip supporting unit 26. Then, as shown in FIG. 27(f), the chip supporting unit 26 is separated from the upper face of the expander 33, so as to be transported.

When the expandable tape 23 was charged positive with an amount of charge of +20 kV/inch in each of the states of FIGS. 27(a) and (b), the amount of charge of the expandable tape 23 became 0 kV/inch in each of the states of FIGS. 27(c) to (e) since the expandable tape 23 and expander 33 had a large contact area therebetween. In the state of FIG. 27(d), the chips 25, 25 peeled off from each other, so that the amount of charge of the expandable tape 23 instantaneously changed, whereby particles having peeled off from cut sections of the chips 25 slightly dispersed and attached onto the chips 25, thus yielding a total dust amount of 4 on the chips 25.

Though the amount of charge of the expandable tape 23 was 0 kV/inch in each of the states of FIGS. 27(c) to (e), the expandable tape 23 was separated from the expander 33 and rapidly recharged positive in the state of FIG. 27(f), so that its amount of charge returned to +20 kV/inch. As a consequence, the particles having peeled off from the cut sections of the chips 25 dispersed greatly and attached onto the chips 25, whereby the total dust amount on the chips 25 became 114.

A large amount of particles also attached onto the chips 25 as such when the expandable tape 23 was electrically charged negative with an amount of charge of −20 kV/inch in each of the states of FIGS. 27(a) and (b). When not electrically charged in each of the states of FIGS. 27(a) and (b), the expandable tape 23 was not charged rapidly in the state of FIG. 27(f), whereby the particles having peeled off from the cut sections of the chips 25 only slightly dispersed and attached onto the chips 25 in the state of FIG. 27(d).

FIG. 28 is a table showing changes in the amount of charge in an expandable tape and changes in the amount of dust on chips when using a cylindrical expander.

The states of FIGS. 28(a) to (f) are the same as those of FIGS. 27(a) to (f) using the columnar expander 33, respectively, except that a cylindrical expander 34 is used.

When the expandable tape 23 was electrically charged positive in each of the states of FIGS. 28(a) and (b) with an amount of charge of +20 kV/inch here, the amount of charge of the expandable tape 23 was still +20 kV/inch in each of the states of FIGS. 28(c) to (e) since the expandable tape 23 and expander 34 had a small contact area therebetween. In the state of FIG. 28(d), the chips 25, 25 peeled off from each other, so that the amount of charge of the expandable tape 23 instantaneously changed, whereby particles having peeled off from cut sections of the chips 25 slightly dispersed and attached onto the chips 25, thus yielding a total dust amount of 4 on the chips 25.

The amount of charge of the expandable tape 23, which had been +20 kV/inch in each of the states of FIGS. 28(c) to (e), was still +20 kV/inch in the state of FIG. 28(f) without changing substantially. As a consequence, the particles having peeled off from the cut sections of the chips 25 did not disperse greatly, whereby the total dust amount on the chips 25 was still 4.

A large amount of particles were also prevented from attaching onto the chips 25 as such when the expandable tape 23 was electrically charged negative with an amount of charge of −20 kV/inch in each of the states of FIGS. 28(a) and (b). When the expandable tape 23 was not electrically charged in each of the states of FIGS. 28(a) and (b), the expandable tape 23 was not charged rapidly in the state of FIG. 28(f), whereby the particles having peeled off from the cut sections of the chips 25 only slightly dispersed and attached onto the chips 25 in the state of FIG. 28(d).

Figure 29:
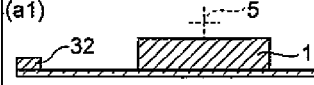
FIG. 29 is a table showing changes in the amount of charge in an antistatic expandable tape and changes in the amount of dust on chips when using the antistatic expandable tape.

FIG. 29 is a table showing changes in the amount of charge in an antistatic expandable tape and changes in the amount of dust on chips when using the antistatic expandable tape.

The states of FIGS. 29(a) to (f1) are the same as those of FIGS. 27(a) to (f) using the expandable tape 23 having no antistatic function, respectively, except that an antistatic expandable tape 35 is used. The states of FIGS. 29(a2) to (f2) are the same as those of FIGS. 27(a) to (f) using the expandable tape 23 having no antistatic function, respectively, except that the antistatic expandable tape 35 is used.

As shown in FIGS. 29(g1) and (g2), the chips 25 are transferred from the antistatic expandable tape 35 to the expandable tape 23 having no antistatic function. This is because the charging step (i.e., the step of electrically charging at least the expandable tape 23 in the state where the chips 25, 25 are separated from each other on the expandable tape 23) will follow the cutting step as mentioned above.

Here, in each of the states of FIGS. 29(a1) to (f1) and 29(a2) to (f2), the expandable tape 35 had an antistatic function, so that its amount of charge was 0 kV/inch. The amount of charge of the expandable tape 23 was also 0 kV/inch in the states of FIGS. 29(g1) and (g2). As a consequence, particles having peeled off from cut sections of the chips 25 did not disperse greatly, so that only the particles slightly dispersing in the states of FIGS. 29(d1) and (d2) attached onto the chips 25, which yielded a total dust amount of 4 on the chips 25.

As explained in the foregoing, using the cylindrical expander 34 or antistatic expandable tape 35 (the case of FIG. 28 or 29) can restrain particles peeled off from cut sections of the chips 25 from dispersing randomly in the cutting step and reliably prevent the particles from attaching onto the chips 25 at the time of expanding the expandable tape 23 or 35.

An example of the columnar expander 33 is TEX-21 (for 8 inch) by Technovision Inc., while an example of the cylindrical expander 34 is a diebonder BESTEM-D02 for a diameter of 300 mm by Canon Machinery Inc. Examples of the antistatic expandable tape 35 include FSL-N4000 (antistatic grade) by Sumitomo Bakelite Co., Ltd. and Adwill D-820 by Lintec Corporation.

Though the cutting step of each of the above-mentioned embodiments destaticizes a forming material of the object 1 or the expandable tape 23 by using a destaticizer of soft x-ray irradiation type, corona discharge type, or the like, so as to cut the object 1 into the semiconductor chips 25 such that the amount of charge of the forming material of the object 1 becomes substantially 0 (zero), it is not restrictive. For example, as mentioned above, the cylindrical expander 34 or the antistatic expandable tape 35 may be used, so as to cut the object 1 into the semiconductor chips 25 such that the amount of charge of the expandable tape becomes substantially constant (substantially 0 (zero) when using the antistatic expandable tape). This can also restrain particles peeled off from cut sections of the semiconductor chip 25 from dispersing randomly and reliably prevent the particles from attaching to the surfaces of the semiconductor chips 25.

The present invention can reliably remove particles remaining on cut sections of chips.

What is claimed is:

1. An object cutting method of manufacturing a plurality of chips by cutting a planar object to be processed along a cutting line, the method comprising:
- a forming step of irradiating the object with laser light so as to form a modified region in the object along the cutting line;
- a separating step of expanding a first sheet attached to the object so as to separate the chips attached to the first sheet from each other, wherein at least one of the forming step and the separating step results in the chips being cut from one another by cutting the object using the modified region as a cutting start point; and
- a charging step of irradiating at least the first sheet with a chargeable first ion flow in a state where the chips are attached to the first sheet and separated from each other after the separating step.

2. An object cutting method according to claim 1, wherein, in the charging step, a second sheet is arranged such as to oppose the first sheet while holding the chips therebetween, and a dischargeable second ion flow is generated at least in an area between the chips and the second sheet.

3. An object cutting method according to claim 1, wherein, in the charging step, a second sheet is arranged such as to oppose the first sheet while holding the chip therebetween, and at least the second sheet is irradiated with a second ion flow chargeable to a polarity opposite from that of the first ion flow.

4. An object cutting method according to claim 1, wherein, in the charging step, at least the first sheet is irradiated with the first ion flow in a state where the chips are separated from each other on the first sheet while a second sheet covering at least a gap between the chips is arranged such as to oppose the first sheet with the chips interposed therebetween.

5. An object cutting method according to claim 1, wherein, in the charging step, in a state where the chips are separated from each other on the first sheet while a porous second sheet covering at least a gap between the chips is arranged such as to oppose the first sheet with the chips interposed therebetween, at least the first sheet is irradiated with the first ion flow while at least the gap is aspirated through the second sheet.

6. An object cutting method according to claim 1, wherein, in the charging step, the chips and first sheet are positioned such that the first sheet is located higher than the chips in a vertical direction.

7. An object cutting method according to claim 1, wherein, in the charging step, the first sheet is irradiated with the first ion flow from a side of the first sheet opposite from the side attached to the chips.

8. An object cutting method according to claim 1, wherein, in the cutting of the object, the object is cut into the chips such that at least one of a forming material of the object and the first sheet has a substantially constant amount of charge.

9. An object cutting method according to claim 1, wherein the object comprises a semiconductor substrate, and wherein the modified region includes a molten processed region.

10. An object cutting method of manufacturing a plurality of chips by cutting a planar object to be processed along a cutting line, the method comprising:
- a forming step of irradiating the object with laser light so as to form a modified region in the object along the cutting line;
- a separating step of expanding a first sheet attached to the object so as to separate the chips attached to the first sheet from each other, wherein at least one of the forming step and the separating step results in the chips being cut from one another by cutting the object using the modified region as a cutting start point; and
- a charging step of electrically charging at least the first sheet in a state where the chips are attached to the first sheet and separated from each other after the separating step.

11. An object cutting method according to claim 10, wherein, in the cutting of the object, the object is cut into the chips such that at least one of a forming material of the object and the first sheet has a substantially constant amount of charge.

12. An object cutting method according to claim 10, wherein the object comprises a semiconductor substrate, and wherein the modified region includes a molten processed region.

* * * * *